US006786936B2

(12) United States Patent
Vaartstra

(10) Patent No.: US 6,786,936 B2
(45) Date of Patent: Sep. 7, 2004

(54) METHODS, COMPLEXES, AND SYSTEMS FOR FORMING METAL-CONTAINING FILMS ON SEMICONDUCTOR STRUCTURES

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 09/865,612

(22) Filed: May 25, 2001

(65) Prior Publication Data

US 2001/0055877 A1 Dec. 27, 2001

Related U.S. Application Data

(62) Division of application No. 09/146,003, filed on Sep. 2, 1998, now Pat. No. 6,281,124.

(51) Int. Cl.[7] .............................................. H01L 21/00
(52) U.S. Cl. ..................................... 29/25.01; 118/715
(58) Field of Search ........................... 118/715, 723 E, 118/723 I, 726; 29/25.01; 438/618, 681; 117/104; 156/345; 556/176

(56) References Cited

U.S. PATENT DOCUMENTS

| | | |
|---|---|---|
| 5,015,747 A | 5/1991 | Hostalek et al. |
| 5,036,022 A | 7/1991 | Kuech et al. |
| 5,084,128 A | 1/1992 | Baker |
| 5,112,432 A | 5/1992 | Erdmann et al. |
| 5,180,687 A | 1/1993 | Mikoshiba et al. |
| 5,259,915 A | 11/1993 | Pohl et al. |
| 5,384,289 A | 1/1995 | Westmoreland et al. |
| 5,451,260 A | 9/1995 | Versteeg et al. |
| 5,545,591 A | 8/1996 | Sugai et al. |
| 5,607,722 A | 3/1997 | Vaartsrta et al. |
| 5,659,057 A | 8/1997 | Vaartstra |
| 5,863,836 A | 1/1999 | Jones |
| 5,924,012 A | 7/1999 | Vaartstra |
| 6,244,575 B1 | 6/2001 | Vaartstra |
| 6,281,124 B1 | 8/2001 | Vaartstra |
| 6,306,217 B1 * | 10/2001 | Uhlenbrock et al. |
| 6,328,804 B1 * | 12/2001 | Murzin et al. ............... 118/715 |
| 6,444,041 B2 | 9/2002 | Vaartstra |

FOREIGN PATENT DOCUMENTS

| | | |
|---|---|---|
| DE | 295 876 A5 | 11/1991 |
| DE | 42 13 292 A1 | 10/1993 |

OTHER PUBLICATIONS

Clabes et al., "Chemical reaction and Schottky–barrier formation at V/Si interfaces," *Physical Review B*, 29(4), 1540–1550 (1984).
Hostalek et al., "Novel Organometallic Starting Materials for Group III–V Semiconductor Metal–Organic Chemical Vapour Deposition," *Thin Solid Films* 174:1–4 (1989).
Leung et al., "Synthesis and structural characterisation of mono— and bi— nuclear cobalt(II) alkyls," *J. Chem. Soc. Dalton Trans.* 779–786 (1997).
Morgan et al., "A Surface EXAFS Study of the Vanadium/Si(111) Interface," *Surface Science*, 204, 428–444 (1988).
Remenyuk et al., "The ohmic contact to the silicon Schottky barrier using vanadium silicide and gold or silver metallization," *Applied Surface Science*, 91, 352–354 (1995).
Scherer et al., "Amine–Stabilized Cyclopentadienyl Diisobutyl Aluminium Complexes as New Kinds of Precursors for the Deposition of Thin Aluminum Films by CVD," *Chem. Vap. Deposition* 3:33–35 (1997).

(List continued on next page.)

Primary Examiner—George Fourson
(74) Attorney, Agent, or Firm—Mueting, Raasch & Gebhardt, P.A.

(57) ABSTRACT

A method of forming a film on a substrate using Group IVB, VB, or VIB metal complexes. The methods are particularly suitable for the preparation of semiconductor structures using chemical vapor deposition techniques and systems.

21 Claims, 3 Drawing Sheets

OTHER PUBLICATIONS

Schumann et al., "Intramolecularly Stabilized Organoaluminium, –gallium and –indium Derivatives/Crystal Structures of {o–[(Dimethylamino)methyl]phenyl} dimethylgallium and {o–[(Diethylamino)methyl]phenyl} dimethylindium," *Chem. Ber. 123*:2093–2099 (1990).

Singer, "Filling Contacts and Vias: A Progress Report," *Semiconductor Int'l* 89–90,92,94 (1996).

Van Koeten et al., "1, 4–Diaza–1, 3–butadiene (α–Diimine) Ligands: Their Coordination Modes and the Reactivity of Their Metal Complexes," *Advances in Organometallic Chemistry, 21*, 151–239 (1982).

Versteeg et al., "Metalorganic Chemical Vapor Deposition by Pulsed Liquid Injection Using An Ultrasonic Nozzle: Titanium Dioxide on Sapphire from Titanium (IV) Isopropoxide," *J. of the American Ceramic Society, 78*, 2763–2768 (1995).

* cited by examiner

METHODS, COMPLEXES, AND SYSTEMS FOR FORMING METAL-CONTAINING FILMS ON SEMICONDUCTOR STRUCTURES

This is a division of application Ser. No. 09/146,003, filed Sep. 2, 1998, now U.S. Pat. No. 6,281,124 incorporated herein by reference.

FIELD OF THE INVENTION

This invention relates to methods and complexes for forming metal-containing films, such as metal or metal alloy films, on substrates, particularly during the manufacture of semiconductor device structures. The complexes include a Group IVB, VB, or VIB metal and are particularly suitable for use in a chemical vapor deposition system.

BACKGROUND OF THE INVENTION

As device geometries shrink it is becoming increasingly important to look at alternatives for titanium as a contact/barrier material. For example, as contact holes or vias (i.e., very small openings located, for example, between surface conductive paths and or "wiring" and active devices on underlying layers) become narrower and deeper, they are harder to fill with metal. Also, metalorganic sources for titanium nitride, for example, which is used as a metallization barrier, are particularly difficult to find that have sufficiently low and stable resistance to be suitable for very small contacts. Furthermore, it is difficult to deposit pure titanium by chemical vapor deposition at low temperatures because currently available precursors require high temperatures to remove halogen from films deposited from titanium halides or are contaminated with carbon when common metalorganic precursors are used.

Thus, there is a continuing need for methods and precursor compositions for the deposition of titanium and metals that are suitable replacements for titanium in metal-containing films, on substrates such as those used in semiconductor structures, particularly using vapor deposition processes.

SUMMARY OF THE INVENTION

The present invention provides methods for forming metal-containing films, particularly Group IVB, VB, and VIB metal-containing films on substrates, such as semiconductor substrates or substrate assemblies during the manufacture of semiconductor structures. Group IVB (i.e., Group 4) includes Ti, Zr, and Hf. Group VB (i.e., Group 5) includes V, Nb, and Ta. Group VIB (i.e., Group 6) includes Cr, Mo, and W. The methods involve forming a metal-containing film using a Group IVB, VB, or VIB metal complex, preferably a Group VB metal complex. The metal-containing film can be used in various metallization layers, particularly in multilevel interconnects, in integrated circuit structures.

The metal-containing film can be a single Group IVB, VB, or VIB metal, or a metal alloy containing a mixture of such metals or one or more metals from these groups and one or more metals or metalloids from other groups in the Periodic Chart, such as Si, Ge, Sn, Pb, Bi, etc. Furthermore, for certain preferred embodiments, the metal-containing film can be a nitride, phosphide, arsenide, stibnide, sulfide, selenide, telluride, or combinations thereof.

Thus, in the context of the present invention, the term "Group IVB-VIB metal-containing film" or simply "metal-containing film" includes, for example, relatively pure films of titanium, zirconium, hafnium, vanadium, niobium, tantalum, chromium, molybdenum, or tungsten. The term also includes alloys of such metals with or without other metals or metalloids, as well as complexes of these metals and alloys with other elements (e.g., N, P, As, Sb, S, Se, and Te), or mixtures thereof. The terms "single Group IVB-VIB metal film" or "Group IVB-VIB metal film" refer to relatively pure films of titanium, zirconium, hafnium, vanadium, niobium, tantalum, chromium, molybdenum, or tungsten. The term "metal alloy film" refers to films containing titanium, zirconium, hafnium, vanadium, niobium, tantalum, chromium, molybdenum, and tungsten in various combinations with each other or with other metals or metalloids. That is, if there are no metals or metalloids from groups in the Periodic Chart other than those from Groups IVB, VB, or VIB, the alloy films contain combinations of titanium, zirconium, hafnium, vanadium, niobium, tantalum, chromium, molybdenum, and tungsten.

One preferred method of the present invention involves forming a film on a substrate, such as a semiconductor substrate or substrate assembly during the manufacture of a semiconductor structure, by providing a substrate (preferably, a semiconductor substrate or substrate assembly), and providing a precursor composition comprising one or more complexes of the formula:

$$[(R^1)NC(R^2)C(R^3)N(R^4)]_xML_y \quad \text{(Formula I)}$$

wherein: M is a Group IVB, VB, or VIB metal; each $R^1$, $R^2$, $R^3$, and $R^4$ group is independently H or an organic group; L is selected from the group of CO, NO, CN, CS, $CNR^5$, $R^6CN$, or $R^7$, wherein each $R^5$, $R^6$, and $R^7$ group is independently an organic group; x=1 to 4; and y=1 to 4; and forming a metal-containing film from the precursor composition on a surface of the substrate (preferably, a semiconductor substrate or substrate assembly). Using such methods the complexes of Formula I are converted in some manner (e.g., thermally decomposed) and deposited on a surface to form a metal-containing film. Thus, the film is not a film of the complex of Formula I, but may contain only the Group IVB, VB, or VIB metal, M, or metal alloys, for example.

As used herein, Formula I is an empirical formula. That is, it expresses in simplest form the relative number of atoms in a molecule. Thus, the compounds of Formula I can be monomers, dimers, trimers, etc. Typically, however, they are monomers and Formula I is the actual molecular formula. Such complexes are typically referred to as "diazadiene" or "diazabutadiene" complexes.

Complexes of Formula I are neutral complexes and may be liquids or solids at room temperature. If they are solids, they are preferably sufficiently soluble in an organic solvent or have melting points below their decomposition temperatures such that they can be used in flash vaporization, bubbling, microdroplet formation techniques, etc. However, they may also be sufficiently volatile that they can be vaporized or sublimed from the solid state using known chemical vapor deposition techniques. Thus, the precursor compositions of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material, preferably, however, there is a sufficient amount of the material that can be carried by the organic solvent into the vapor phase for chemical vapor deposition processing. Thus, a vaporized presursor composition includes vaporized molecules of precursor complexes of Formula I either alone or optionally with vaporized molecules of other compounds in the precursor composition, including solvent molecules, if used.

Preferred embodiments of the methods of the present invention involve the use of one or more chemical vapor deposition techniques, although this is not necessarily required. That is, for certain embodiments, sputtering, spin-on coating, etc., can be used.

Methods of the present invention are particularly well suited for forming films on a surface of a semiconductor substrate or substrate assembly, such as a silicon wafer, with or without layers or structures formed thereon, used in forming integrated circuits. It is to be understood that methods of the present invention are not limited to deposition on silicon wafers; rather, other types of wafers (e.g., gallium arsenide wafer, etc.) can be used as well. Also, methods of the present invention can be used in silicon-on-insulator technology. Furthermore, substrates other than semiconductor substrates or substrate assemblies, can be used in methods of the present invention. These include, for example, fibers, wires, etc. If the substrate is a semiconductor substrate or substrate assembly, the films can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon-on-sapphire. The term "semiconductor substrate assembly" refers to the semiconductor substrate having one or more layers or structures formed thereon.

A chemical vapor deposition system is also provided. The system includes a deposition chamber having a substrate positioned therein; a vessel containing a precursor composition comprising one or more complexes of Formula I; and a source of an inert carrier gas for transferring the precursor composition to the chemical vapor deposition chamber.

DETAILED DESCRIPTION

Figure 1:
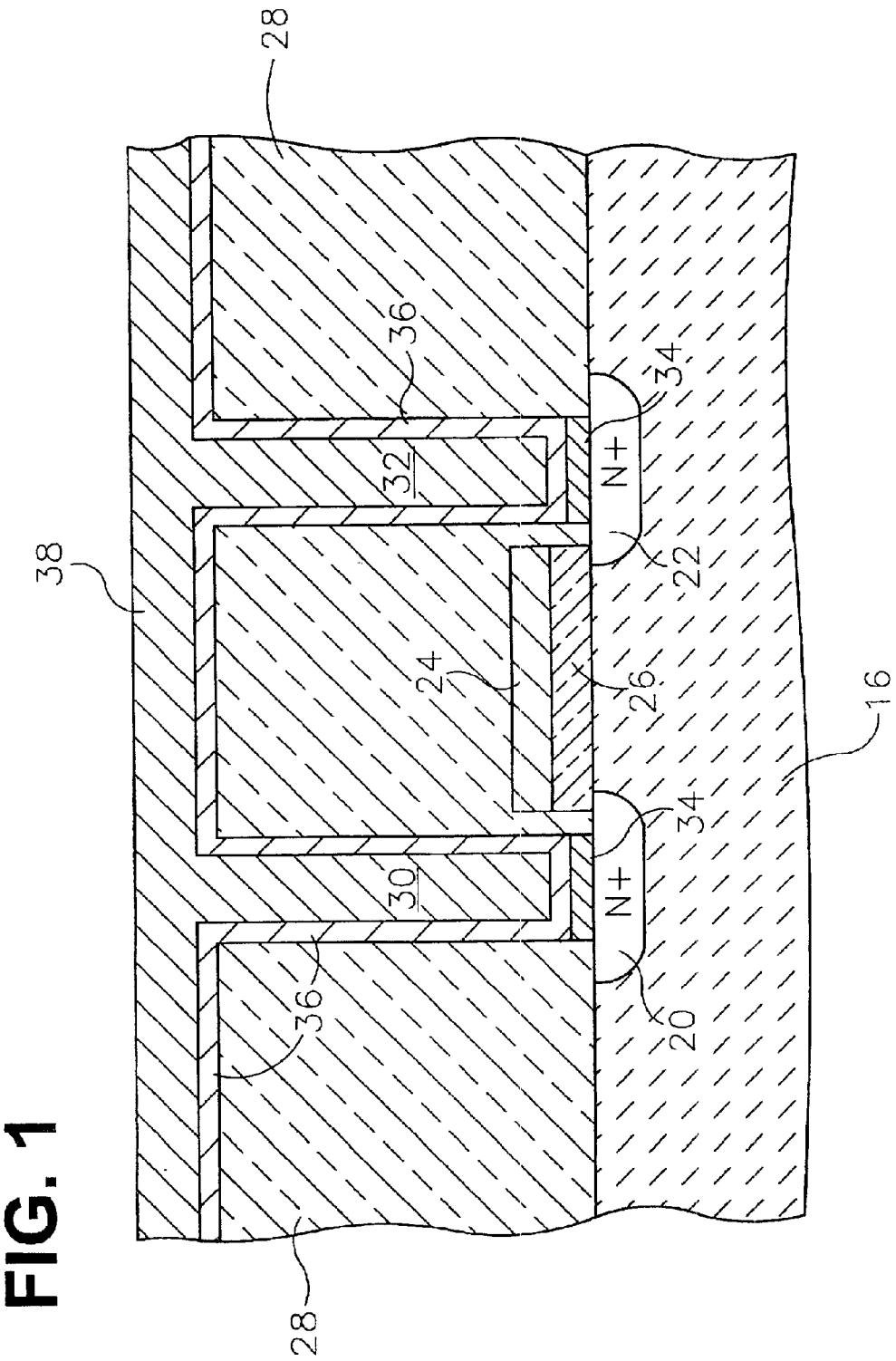
FIG. 1 is a cross-sectional schematic of a semiconductor contact or via having a film deposited in accordance with the method of the present invention.

The present invention provides a method of forming a metal-containing film using one or more complexes of Formula (1):

$$[(R^1)NC(R^2)C(R^3)N(R^4)]_x ML_y \quad (1)$$

wherein M is a Group IVB, VB, or VIB metal; each $R^1$, $R^2$, $R^3$, and $R^4$ group is independently H or an organic group (preferably, a ($C_1$–$C_{30}$)organic group); L is selected from the group of CO, NO, CN, CS, $CNR^5$, $R^6CN$, or $R^7$, wherein each $R^5$, $R^6$, and $R^7$ group is independently an organic group (preferably, a ($C_1$–$C_{30}$)organic group, more preferably, $R^7$ is cyclopentadienyl); x=1 to 4 (preferably, 2 or 3); and y=1 to 4. In a preferred embodiment, complexes of Formula I include a Group VB metal. Preferably, such complexes are mononuclear (i.e., monomers in that they contain one metal per molecule). Thus, the complexes are preferably mononuclear diazadiene (i.e., diazabutadiene) complexes. Preferred embodiments display few intermolecular forces of attraction. However, it is also possible for one or more molecules of Formula I to combine to form dimers, trimers, etc. Thus, the complexes of Formula I are expressed in their simplest form, i.e., Formula I is an empirical formula The complexes of Formula I are neutral complexes and may be liquids or solids at room temperature. If they are solids, they are sufficiently soluble in an organic solvent to allow for flash vaporization, or they can be vaporized or sublimed from the solid state, or they have melting temperatures below their decomposition temperatures. Thus, many of the complexes described herein are suitable for use in chemical vapor deposition (CVD) techniques, such as flash vaporization techniques, bubbler techniques, and/or microdroplet techniques. Depositions can also be carried out with assistance of plasma or photolysis. Preferred embodiments of the complexes described herein are particularly suitable for low temperature CVD, e.g., deposition techniques involving substrate temperatures of about 100° C. to about 400° C.

The solvents that are suitable for this application can be one or more of the following: saturated or unsaturated branched, linear, or cyclic aliphatic (alicyclic) hydrocarbons ($C_3$–$C_{20}$, and preferably $C_5$–$C_{10}$), aromatic hydrocarbons ($C_5$–$C_{20}$, and preferably $C_5$–$C_{10}$), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitriles, cyanates, isocyanates, thiocyanates, silicone oils, aldehydes, ketones, diketones, carboxylic acids, water, alcohols, thiols, or compounds containing combinations of any of the above or mixtures of one or more of the above. It should be noted that some precursor complexes are sensitive to reactions with protic solvents, and examples of these noted above may not be ideal, depending on the nature of the precursor complex. The complexes are also generally compatible with each other, so that mixtures of variable quantities of the complexes will not interact to significantly change their physical properties.

One preferred method of the present invention involves vaporizing a precursor composition that includes one or more Group IVB, VB, or VIB metal complexes of Formula I. For certain embodiments, the precursor composition can also include one or more complexes containing metals or metalloids other than Group IVB, VB, or VIB metals. For example, the precursor composition can include a compound containing N, P, As, or Sb.

The precursor composition can be vaporized in the presence of an inert carrier gas to form a relatively pure metal or metal alloy film. The inert carrier gas is typically selected from the group consisting of nitrogen, helium, and argon. In the context of the present invention, an inert carrier gas is one that is generally unreactive with the complexes described herein and does not interfere with the formation of the metal-containing film.

Alternatively, the precursor composition can be vaporized in the presence of a reaction gas to form a film. The reaction gas can be selected from a wide variety of gases reactive with the complexes described herein, at least at a surface under the conditions of chemical vapor deposition. Examples of reaction gases include $H_2$, $SiH_4$, $Si_2H_6$, $NH_3$, $N_2H_4$, $PH_3$, $AsH_3$, $GeH_4$, t-$BuSbMe_2$, $H_2S$, $H_2Se$, and $Te(allyl)_2$. Various combinations of carrier gases and/or reaction gases can be used in the methods of the present invention to form metal-containing films. Thus, the metal-containing film can include a nitride, phosphide, arsenide, stibnide, sulfide, selenide, telluride, or combinations thereof. Such metal-containing films can also be formed by subjecting a relatively pure metal film to subsequent processing, such as annealing or rapid thermal oxidation, to form other metal-containing films, such as oxides or suicides, for example.

Preferably, the Group IVB, VB, or VIB metal complexes of Formula I described herein are complexes having a coordination number of 3 to 8 with at least one diazabutadiene ligand, which is typically bidentate. Complexes such as these are advantageous because no other reaction compounds (e.g., reductants) are typically required to deposit the metal on a substrate and cleanly volatilize the ligands away without the incorporation of carbon and nitrogen impurities.

The Group IVB, VB, or VIB metal complex is of the following empirical formula:

$$[(R^1)NC(R^2)C(R^3)N(R^4)]_xML_y \qquad \text{(Formula 1)}$$

wherein: M is a Group IVB, VB, or VIB metal, and preferably, V, Nb, or Ta; each R (i.e., $R^1$, $R^2$, $R^3$, $R^4$) is independently H or an organic group; L is selected from the group of CO, NO, CN, CS, $CNR^5$, $R^6CN$, or $R^7$, wherein each $R^5$, $R^6$, and $R^7$ group is independently an organic group; x=1 to 4 (preferably, x=2 or 3); y=1 to 4. The ligand $[(R^1)NC(R^2)C(R^3)N(R^4)]$ typically bonds to the central metal through the nitrogen atoms as follows:

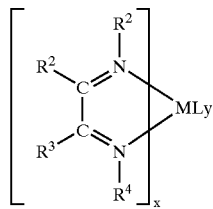

The ligands L can be organic groups ($R^7$) that can be joined to form a ring or rings with the metal. Preferably, these organic groups include 1–30 carbon atoms, and more preferably, 1–8 carbon atoms. Most preferably, L is cyclopentadienyl or substituted cyclopentadienyl. Of the metals, vanadium is particularly preferred because it will react with native silicon oxide to form a good contact. Vanadium silicides and nitrides are also as good or better conductors than their titanium analogs.

As used herein, the term "organic group" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). In the context of the present invention, the organic groups are those that do not interfere with the formation of a metal-containing film. Preferably, they are of a type and size that do not interfere with the formation of a metal-containing film using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

Substitution is anticipated in the complexes of the present invention. As a means of simplifying the discussion and the recitation of certain terminology used throughout this application, the terms "group" and "moiety" are used to differentiate between chemical species that allow for substitution or that may be substituted and those that do not so allow or may not be so substituted. Thus, when the term "group" is used to describe a chemical substituent, the described chemical material includes the unsubstituted group and that group with nonperoxidic O, N, or S atoms, for example, in the chain (as in an alkoxy group) as well as carbonyl groups or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

The R groups can be joined to form a ring or rings, which may or may not have unsaturation, including aromaticity. Preferred R groups ($R^1$, $R^2$, $R^3$, and $R^4$) in the complexes of Formula I, include H or ($C_1$–$C_{30}$)organic groups. More preferred R groups ($R^1$, $R^2$, $R^3$, and $R^4$) are H or ($C_1$–$C_{20}$) organic groups. Most preferred R groups ($R^1$, $R^2$, $R^3$, and $R^4$) are H or ($C_1$–$C_8$)organic groups. For certain embodiments, ($C_1$–$C_6$)organic groups are particularly preferred. Of the organic groups, nonaromatic groups (e.g., aliphatic groups and alicyclic groups, which may or may not include unsaturation, and which may or may not include heteroatoms such as N, O, S, P, Si, etc.) are preferred. Of these, the aliphatic groups are more preferred, and alkyl moieties (particularly "lower" ($C_1$–$C_4$)alkyl moieties) are most preferred. Thus, for particularly preferred complexes of Formula I, each R group ($R^1$, $R^2$, $R^3$, and $R^4$) can be H or a ($C_1$–$C_4$)alkyl moiety.

Various combinations of the complexes described herein can be used in a precursor composition. Thus, as used herein, a "precursor composition" refers to a liquid or solid that includes one or more complexes of the formulas described herein optionally mixed with one or more complexes of formulas other than those of Formula I. The precursor composition can also include one or more organic solvents suitable for use in a chemical vapor deposition system, as well as other additives, such as free ligands, that assist in the vaporization of the desired compounds.

The complexes described herein can be used in precursor compositions for chemical vapor deposition. Alternatively, certain complexes described herein can be used in other deposition techniques, such as sputtering, spin-on coating, and the like. Typically, those complexes containing R groups with a low number of carbon atoms (e.g., 1–4 carbon atoms per R group) are suitable for use with CVD techniques. Those complexes containing R groups with a higher number of carbon atoms (e.g., 5–12 carbon atoms per R group) are generally suitable for spin-on or dip coating. Preferably, however, chemical vapor deposition techniques are desired because they are more suitable for deposition on semiconductor substrates or substrate assemblies, particularly in contact openings which are extremely small and require conformally filled layers of metal.

For the preparation of alloy films, two or more complexes of Formula I can be combined in a precursor composition mixture (e.g., $V(CO)_x(^tBuN=CHCH=N^tBu)$ and $Nb(CO)_y(^tBuN=CHCH=N^tBu)$ for a V/Nb alloy). Alternatively, at least one complex of Formula I can be combined with another complex in a precursor composition mixture (e.g., $Ti(C_5H_5)(^iPrN=CHCH=N^iPr)_2$ and $Al(Et)_3$ for a Ti/Al alloy).

The complexes of the present invention can be prepared by a variety of methods known to one of skill in the art. For example, $V(CO)_x(^tBuN=CHCH=N^tBu)$ can be prepared by reduction of $VCl_3$ with Na in the presence of ($^tBuN=CHCH=N^tBu$) and CO.

As stated above, the complexes of Formula I and methods of forming metal-containing films of the present invention are beneficial for a wide variety of thin film applications in semiconductor structures, particularly various metallization layers. Such applications include multilevel interconnects in an integrated circuit structure. A film can be deposited in a wide variety of thicknesses, depending on the desired use. Typically, thin films of Group IVB, VB, or VIB metals, such as vanadium, and alloys thereof are deposited as polycrystalline materials, usually in a range of about 0.5 $\mu$m to about 1.5 $\mu$m thick.

A specific example of where a film formed from the complexes of the present invention would be useful is the structure shown in FIG. 1. The structure may be in the form of an n-channel MOSFET (n-channel metal-oxide semiconductor field-effect transistor), which may be used in a DRAM (dynamic random access memory) device. As shown, substrate 16 is a p-type silicon having two n-type silicon islands 20 and 22, representing the transistor source and drain. Such a construction is well known. The gate for the transistor is formed by a metal/polysilicon layer 24 deposited over a silicon dioxide layer 26. A relatively thick layer of an insulating silicon dioxide 28 overlies the active areas on substrate 16.

To connect the MOSFET with electrically conductive paths (i.e., metal lines) on the surface of the device, contacts 30 and 32 have been etched through oxide layer 28 down to the surface of substrate 16. A metal or metal silicide layer 34, such as vanadium silicide or other metal-containing film prepared by the methods of the present invention, is deposited and formed at the base of contact holes 30 and 32. A thin, conformal barrier layer 36 of a conductive material, such as titanium nitride, titanium aluminum nitride, titanium nitride siticide, tantalum nitride, or other metal-containing film prepared by the methods of the present invention, is deposited over the walls of the contact holes 30 and 32. Because of the presence of the conductive barrier layer 36, the electrical contact path is excellent and the metal 38 (e.g., Al or Cu) which is deposited over barrier layer 36 is prevented from attacking the substrate surfaces.

Methods of the present invention can be used to deposit a metal-containing film, preferably a metal or metal alloy film, on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. The film is deposited upon decomposition (typically, thermal decomposition) of a complex of Formula I, preferably one that is either a volatile liquid, a sublimable solid, or a solid that is soluble in a suitable solvent that is not detrimental to the substrate, other layers thereon, etc. Preferably, however, solvents are not used; rather, the transition metal complexes are liquid and used neat. Methods of the present invention preferably utilize vapor deposition techniques, such as flash vaporization, bubbling, etc.

Figure 2:
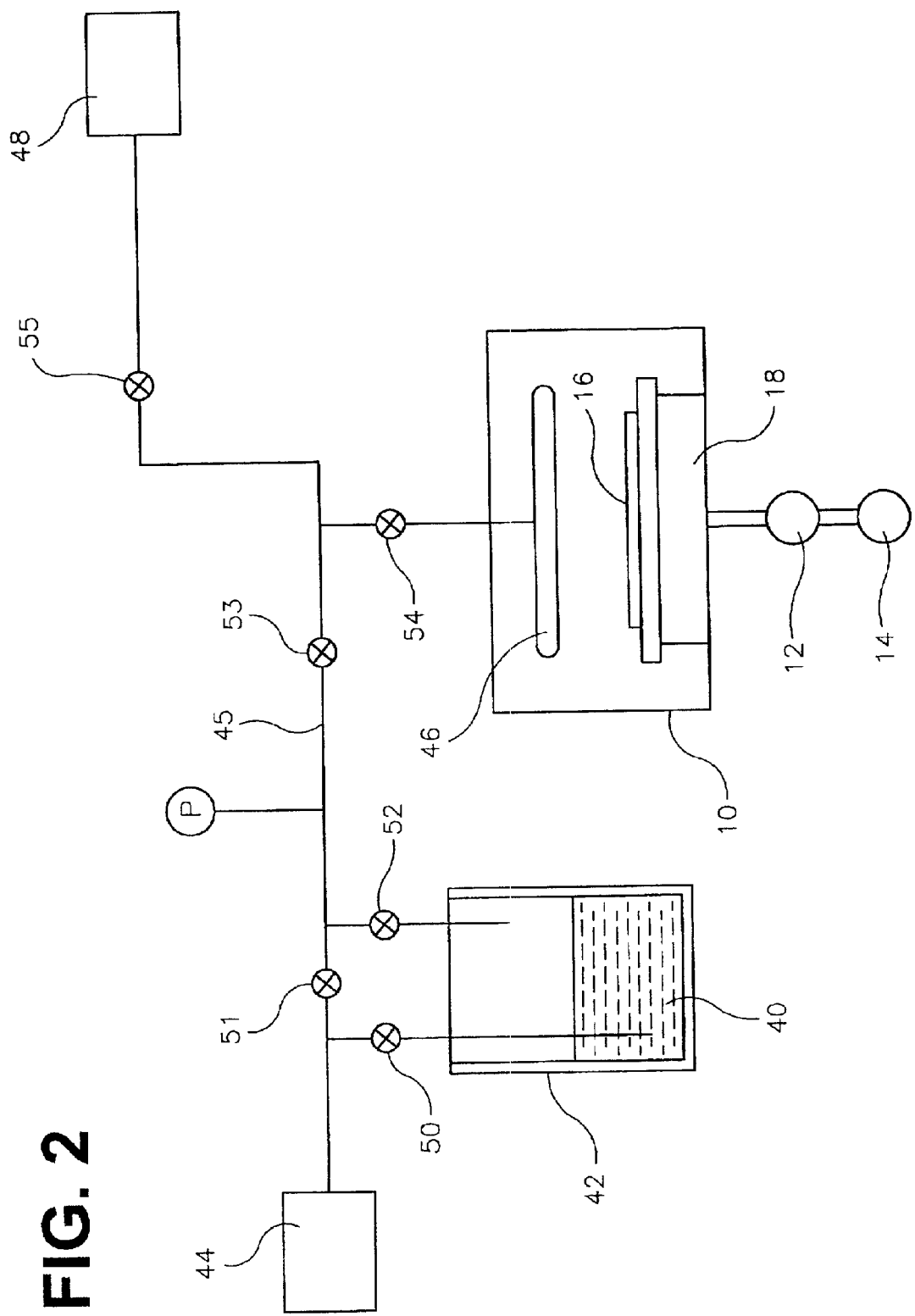
FIG. 2 is a schematic of a chemical vapor deposition system suitable for use in the method of the present invention.

A typical chemical vapor deposition (CVD) system that can be used to perform the process of the present invention is shown in FIG. 2. The system includes an enclosed chemical vapor deposition chamber 10, which may be a cold wall-type CVD reactor. As is conventional, the CVD process may be carried out at pressures of from atmospheric pressure down to about $10^{-3}$ torr, and preferably from about 10 torr to about 0.1 torr. A vacuum may be created in chamber 10 using turbo pump 12 and backing pump 14.

One or more substrates 16 (e.g., semiconductor substrates or substrate assemblies) are positioned in chamber 10. A constant nominal temperature is established for the substrate, preferably at a temperature of about 100° C. to about 400° C., and more preferably at a temperature of about 100° C. to about 300° C. Substrate 16 may be heated, for example, by an electrical resistance heater 18 on which substrate 16 is mounted. Other known methods of heating the substrate may also be utilized.

In this process, the precursor composition 40, which contains one or more complexes of Formula I (and/or other metal or metalloid complexes), is stored in liquid form (a neat liquid at room temperature or at an elevated temperature if solid at room temperature) in vessel 42. A source 44 of a suitable inert gas is pumped into vessel 42 and bubbled through the neat liquid (i.e., without solvent) picking up the precursor composition and carrying it into chamber 10 through line 45 and gas distributor 46. Additional inert carrier gas or reaction gas may be supplied from source 48 as needed to provide the desired concentration of precursor composition and regulate the uniformity of the deposition across the surface of substrate 16. Valves 50–54 are opened and closed as required.

Generally, the precursor composition is pumped into the CVD chamber 10 at a flow rate of about 1 sccm (standard cubic centimeters) to about 1000 sccm. Similar flow rates can be used for inert and reaction gases, if used. The semiconductor substrate is exposed to the precursor composition at a pressure of about 0.001 torr to about 100 torr for a time of about 0.01 minute to about 100 minutes. In chamber 10, the precursor composition will form an adsorbed layer on the surface of the substrate 16. As the deposition rate is temperature dependent, increasing the temperature of the substrate will increase the rate of deposition in a certain temperature range. Typical deposition rates are about 10 Angstroms/minute to about 1000 Angstroms/minute. The carrier gas containing the precursor composition is terminated by closing valve 53.

Figure 3:
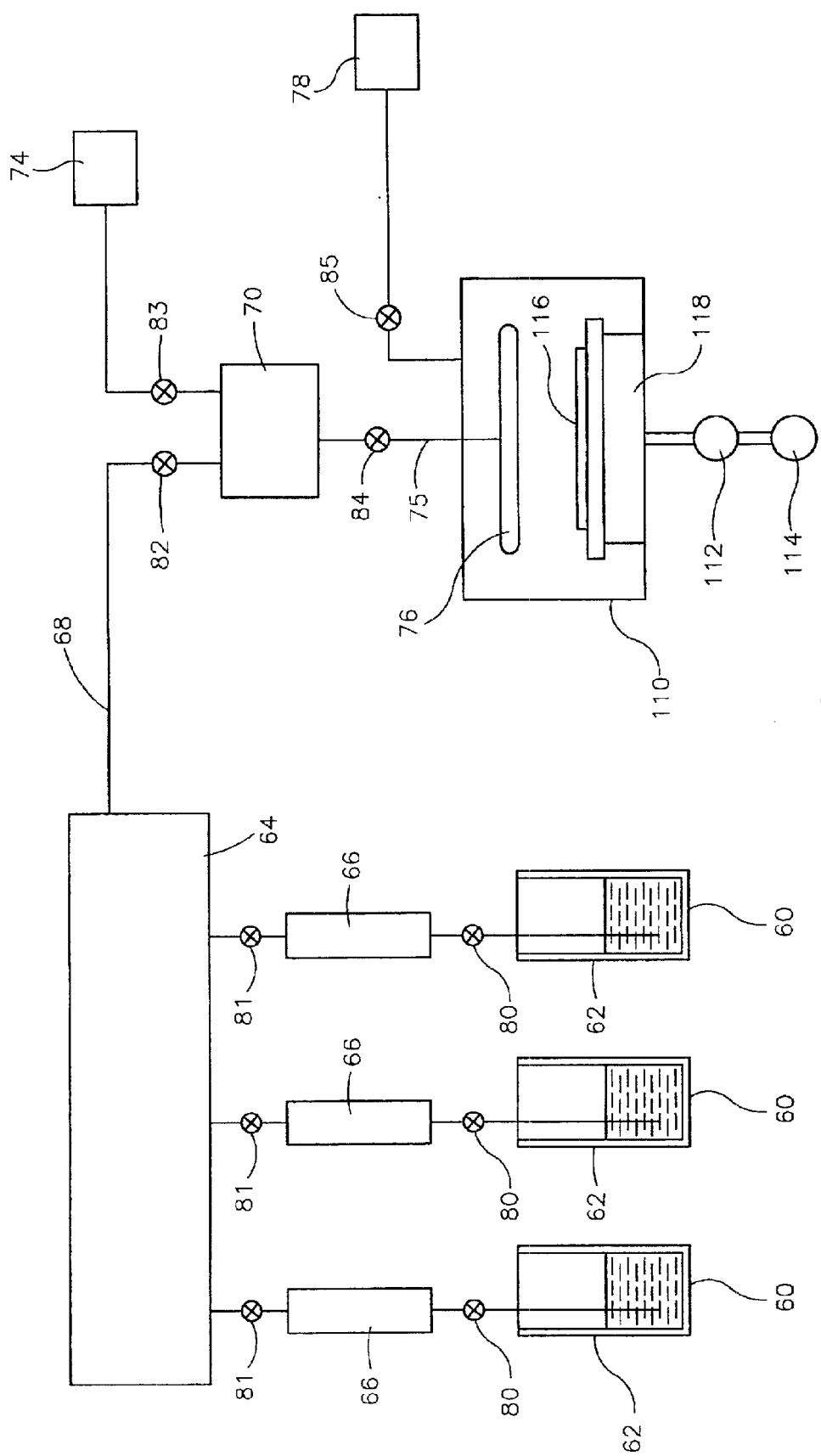
FIG. 3 is a schematic of an alternative chemical vapor deposition system suitable for use in the method of the present invention.

An alternative CVD system that can be used to perform the process of the present invention is shown in FIG. 3. The system includes an enclosed chemical vapor deposition chamber 110, which may be a cold wall-type CVD reactor, in which a vacuum may be created using turbo pump 112 and backing pump 114. One or more substrates 116 (e.g., semiconductor substrates or substrate assemblies) are positioned in chamber 110. Substrate 116 may be heated as described with reference to FIG. 2 (for example, by an electrical resistance heater 118).

In this process, one or more solutions 60 of one or more precursor complexes of Formula I (and/or other metal or metalloid complexes), are stored in vessels 62. The solutions are transferred to a mixing manifold 64 using pumps 66. The resultant precursor composition containing one or more precursor complexes and one or more organic solvents is then transferred along line 68 to vaporizer 70, to volatilize the precursor composition. A source 74 of a suitable inert gas is pumped into vaporizer 70 for carrying volatilized precursor composition into chamber 110 through line 75 and gas distributor 76. Reaction gas may be supplied from source 78 as needed. Valves 80–85 are opened and closed as required. Similar pressures and temperatures to those described with reference to FIG. 2 can be used.

Alternatives to such methods include an approach wherein the precursor composition is heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society*, 78, 2763–2768 (1995). The complexes of Formula I are also particularly well suited for use with vapor deposition systems, as described in copending application U.S. Ser. No. 08/720,710 entitled "Method and Apparatus for Vaporizing Liquid Precursor compositions and System for Using Same," filed on Oct. 2, 1996. Generally, one method described therein involves the vaporization of a precursor composition in liquid form (neat or solution). In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compositions (either in the form of a neat liquid or solid dissolved in a liquid medium) and provides reasonable growth rates, particularly in device applications with small dimensions.

Various combinations of carrier gases and/or reaction gases can be used in certain methods of the present invention. They can be introduced into the chemical vapor deposition chamber in a variety of manners, such as directly into the vaporization chamber or in combination with the precursor composition.

Although specific vapor deposition processes are described by reference to FIGS. 2–3, methods of the present invention are not limited to being used with the specific vapor deposition systems shown. Various CVD process chambers or reaction chambers can be used, including hot wall or cold wall reactors, atmospheric or reduced pressure reactors, as well as plasma enhanced reactors. Furthermore, methods of the present invention are not limited to any specific vapor deposition techniques.

The following examples are offered to further illustrate the various specific and preferred embodiments and techniques. It should be understood, however, that many variations and modifications may be made while remaining within the scope of the present invention.

EXAMPLES

Example 1

Preparation of V(CO)$_y$($^t$BuN=CHCH=N$^t$Bu)

In an inert-atmosphere glove box, VCl$_3$ (3.0 g, 0.019 mol) is added to a flask. The solid is dissolved in 100 mL of tetrahydrofuran (THF). To this solution is added bis (tert-butyl)diazabutadiene (2.93 g, 0.019 mol), followed by sodium wire (138 g, 0.060 mol). The mixture is stirred under an atmosphere of carbon monoxide (which is periodically replaced with fresh CO) for 24 hours. The solvent is then removed in vacuo and the product is extracted into hexanes and filtered. The filtrate is then concentrated and cooled to near 0° C. to precipitate the product. The product is isolated by removing the mother liquor from the precipitate and drying the precipitate in vacuo.

Example 2

Preparation of (C$_5$H$_5$)Ti($^t$BuN=CHCH=N$^t$Bu)

In an inert-atmosphere glove box, (C$_5$H$_5$)TiCl$_3$ (5.0 g, 0.023 mol) is dissolved in 100 mL of THF. Solid bis(tert-butyl)diazabutadiene (3.50 g, 0.023 mol) and sodium wire (1.60 g, 0.07 mol) are added, resulting in immediate reaction. The mixture is stirred for 18 hours, after which time the solvent is removed in vacuo. The product is redissolved in hexanes and filtered; then the hexanes removed in vacuo, leaving the crude product. The product is further purified by subliming onto a cold finger in a vacuum.

Example 3

Preparation of Mo(CO)$_y$($^t$BuN=CHCH=N$^t$Bu)

A Schlenk flask is charged with 5.0 g (0.019 mol) of Mo(CO)$_6$ (Strem (Chemicals Inc., Newburyport, Mass.). The Mo(CO)$_6$ is dissolved in 100 mL of benzene, along with 2.93 g (0.019 mol) of bis(tert-butyl)diazabutadiene. The flask is equipped with a reflux condenser and the mixture is refluxed under an argon atmosphere for 18 hours. The product is isolated by removal of the solvent. It is further purified by subliming onto a cold finger in a vacuum.

Example 4

Preparation of Thin Films

A patterned semiconductor wafer is loaded into a CVD chamber, and the wafer heated to approximately 350° C. The precursor composition, V(CO)$_y$($^t$BuN=CHCH=N$^t$Bu), is loaded into a conventional stainless steel bubbler inside a glove box, and the bubbler transferred to the CVD system. A helium carrier gas flow of 50 standard cubic centimeters per minute (sccm) is established through the bubbler, and a chamber pressure of 0.5 torr is established. A reactant gas flow of 50 sccm hydrogen is introduced separately. The deposition is carried out until a desired thickness of vanadium metal is obtained on the wafer.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A chemical vapor deposition system comprising:
   a deposition chamber having a substrate positioned therein;
   a vessel containing a precursor comprising one or more complexes of the formula:

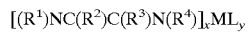

wherein:

M is a group IVB, VB, or VIB metal:

each $R^1$, $R^2$, $R^3$, and $R^4$ is independently H or an organic group;

L is selected from the group of CO, NO, CN, CS, $CNR^3$, $R^8CN$, or $R^7$, wherein each $R^5$, $R^6$, and $R^7$ group is independently an organic group;

x=1 to 4; and y=1 to 4; and a source of inert carrier gas for transferring the precursor to the chemical vapor deposition chamber.

2. A chemical vapor deposition system comprising:

a deposition chamber having a substrate positioned therein;

a vessel containing a precursor composition comprising one or more complexes of the formula:

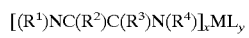

wherein:

M is a Group IVB, VB, or VIB metal;

each $R^1$, $R^2$, $R^3$, and $R^4$ is independently H or an organic group;

each L is independently CO, NO, CN, CS, $CNR^5$, $R^6CN$, or $R^7$, wherein each $R^5$, $R^6$, and $R^7$ group is independently an organic group;

x=1 to 4; and y=1 to 4.

3. The system of claim 2 wherein each $R^1$, $R^2$, $R^3$, and $R^4$ group is independently H or a $(C_1-C_{30})$organic group.

4. The system of claim 2 wherein the complex is a monomer.

5. The system of claim 2 wherein each $R^1$, $R^2$, $R^3$, and $R^4$ group is independently H or a $(C_1-C_4)$alkyl moiety.

6. The system of claim 2 wherein $R^7$ is cyclopentadienyl or a substituted cyclopentadienyl.

7. The system of claim 2 wherein the precursor composition is a liquid.

8. The system of claim 2 wherein the metal is a Group VB metal.

9. The system of claim 8 wherein the metal is vanadium.

10. A chemical vapor deposition system comprising:

a deposition chamber having a semiconductor substrate or substrate assembly positioned therein;

a vessel containing a precursor composition comprising one or more complexes of the formula:

wherein:

M is a Group IVB, VB, or VIB metal;

each $R^1$, $R^2$, $R^3$, and $R^4$ is independently H or a organic group;

each L is independently CO, NO, CN, CS, $CNR^5$, $R^6CN$, or $R^7$, wherein each $R^5$, $R^6$, and $R^7$ group is independently an organic group;

x=1 to 4; and y=1 to 4.

11. The system of claim 10 wherein each $R^1$, $R^2$, $R^3$, and $R^4$ is independently H or a $(C_1-C_{30})$organic group.

12. The system of claim 10 wherein the complex is a monomer.

13. The system of claim 10 wherein each $R^1$, $R^2$, $R^3$, and $R^4$ group is independently H or a $(C_1-C_4)$alkyl moiety.

14. The system of claim 10 wherein $R^7$ is cyclopentadienyl or a substituted cyclopentadienyl.

15. A chemical vapor deposition system comprising:

a deposition chamber having a semiconductor substrate or substrate assembly positioned therein;

a vessel containing a precursor composition comprising one or more liquid complexes of the formula:

wherein:

M is a Group IVB, VB, or VIB metal;

each $R^1$, $R^2$, $R^3$, and $R^4$, independently H or a $(C_1-C_{30})$ organic group;

each L is independently CO, NO, CN, CS, $CNR^5$, $R^6CN$, or $R^7$, wherein each $R^5$, $R^6$, and $R^7$ group is independently an organic group;

x=1 to 4; and y=1 to 4.

16. The system of claim 15 wherein the deposition chamber is adapted for forming a metal-containing film comprising vaporizing the precursor composition and directing it toward the semiconductor substrate or substrate assembly using a chemical vapor depositional technique.

17. The system of claim 16 wherein the chemical vapor deposition technique comprises flash vaporization, bubbling, microdroplet formation, or combinations thereof.

18. The system of claim 16 wherein the precursor composition is vaporized in the presence of a carrier gas.

19. The system of claim 16 wherein the precursor composition is vaporized in the presence of a reaction gas.

20. The system of claim 19 wherein the reaction gas is selected from the group of $H_2$, $SiH_4$, $Si_2H_6$, $NH_3$, $N_2H_4$, $PH_3$, $AsH_3$, $GeH_4$, t-$BuSbMe_2$, $H_2S$, $H_2Se$, $Te(allyl)_2$, and combinations thereof.

21. The system of claim 16 wherein the metal-containing film is a Group IVB, VB, or VIB metal alloy film.

* * * * *

UNITED STATES PATENT AND TRADEMARK OFFICE
CERTIFICATE OF CORRECTION

PATENT NO. : 6,786,936 B2
DATED : September 7, 2004
INVENTOR(S) : Brian A. Vaartstra It is certified that error appears in the above-identified patent and that said Letters Patent is hereby corrected as shown below:

Column 4,
Line 32, please delete "nitrites" and insert -- nitriles --;

Column 5,
Line 8, please delete "suicides" and insert -- silicides --;

Column 7,
Line 61, please delete "siticide" and insert -- silicide --;

Column 10,
Line 29, please delete "(Chemicals" and insert -- Chemicals --;

Column 11,
Line 6, please delete "CNR$^3$, R$^8$CN," and insert -- CNR$^5$, R$^6$CN --.

Signed and Sealed this

Third Day of May, 2005

JON W. DUDAS
*Director of the United States Patent and Trademark Office*